United States Patent
Schoellkopf

(10) Patent No.: US 7,333,380 B2
(45) Date of Patent: Feb. 19, 2008

(54) SRAM MEMORY DEVICE WITH FLASH CLEAR AND CORRESPONDING FLASH CLEAR METHOD

(75) Inventor: Jean-Pierre Schoellkopf, Grenoble (FR)

(73) Assignee: STMicroelectronics SA, Montrouge (FR)

(*) Notice: Subject to any disclaimer, the term of this patent is extended or adjusted under 35 U.S.C. 154(b) by 134 days.

(21) Appl. No.: 11/394,873

(22) Filed: Mar. 31, 2006

(65) Prior Publication Data

US 2006/0233015 A1  Oct. 19, 2006

(30) Foreign Application Priority Data

Apr. 1, 2005  (FR) ................................... 05 03247

(51) Int. Cl.
*G11C 7/20* (2006.01)

(52) U.S. Cl. .................. 365/218; 365/156; 365/154; 365/227; 257/903; 257/901

(58) Field of Classification Search ............... 365/156, 365/154, 218, 222, 227; 257/903, 901
See application file for complete search history.

(56) References Cited

U.S. PATENT DOCUMENTS

| | | | | |
|---|---|---|---|---|
| 3,665,422 A | * | 5/1972 | McCoy et al. | 365/222 |
| 4,233,526 A | * | 11/1980 | Kurogi et al. | 365/184 |
| 4,506,349 A | * | 3/1985 | Mazin et al. | 365/156 |
| 4,961,167 A | * | 10/1990 | Kumanoya et al. | 365/189.09 |
| 5,014,104 A | * | 5/1991 | Ema | 257/371 |
| 5,373,466 A | | 12/1994 | Landeta et al. | 365/189.01 |
| 6,369,630 B1 | * | 4/2002 | Rockett | 327/210 |
| 7,088,606 B2 | * | 8/2006 | Turner | 365/149 |
| 7,173,845 B2 | * | 2/2007 | Coker | 365/154 |
| 2004/0223362 A1 | | 11/2004 | Coker | 365/154 |
| 2006/0233015 A1 | * | 10/2006 | Schoellkopf | 365/154 |

FOREIGN PATENT DOCUMENTS

| | | | |
|---|---|---|---|
| EP | 1011136 A1 | * | 6/2000 |
| EP | 1324340 | | 7/2003 |

* cited by examiner

*Primary Examiner*—Andrew Q. Tran
(74) *Attorney, Agent, or Firm*—Lisa K. Jorgenson; Allen, Dyer, Doppelt, Milbrath & Gilchrist, P.A.

(57) ABSTRACT

A static memory device includes at least one memory cell with two cross-coupled CMOS inverters to be connected to first and second voltages. The substrate of the NMOS transistor of a first CMOS inverter is electrically insulated from the substrate of the NMOS transistor of the second CMOS inverter. The two substrates can be biased with the first voltage. A clear flash controller flash clears the cells for temporarily bring the bias of the substrate of the NMOS transistor of the first CMOS inverter to the second voltage.

21 Claims, 6 Drawing Sheets

SRAM MEMORY DEVICE WITH FLASH CLEAR AND CORRESPONDING FLASH CLEAR METHOD

FIELD OF THE INVENTION

The invention relates to integrated circuits, and more particularly, to a static random access memory (SRAM) having a flash clear function.

BACKGROUND OF THE INVENTION

Certain types of conventional SRAM memory incorporate the flash clear function, by which all the memory cells are set at a given time to a given state (conventionally, for example, a logical 0). The flash clear function, activated in response to a control signal external to the memory, makes it possible to initialize the memory, such as for clearing or testing purposes, for example.

The flash clear of the memory is conventionally carried out by simultaneously selecting all the word lines of the matrix of memory cells so as to select all the memory cells, and by forcing all the bit lines of the matrix of memory cells to a reference potential (typically ground). All the memory cells thus switch to their logical 0 state.

U.S. patent application no. 2003/231538 describes another approach for implementing a flash clear function, which is particularly straightforward to produce and carry out in existing SRAM memories for which a clear function was not originally provided. Such an approach, however, increases the area of the memory because it requires the use of two switches per column and two different supply lines.

SUMMARY OF THE INVENTION

In view of the foregoing background, an object of the invention is to implement the flash clear function in an SRAM memory without increasing the area of the memory, i.e., requiring an additional area.

Another object of the invention to provide management of the flash clear control, produced by a control circuit with low complexity.

Yet another object of the invention is to be applicable to any rectangular arrangement of memory cells regardless of their density.

One aspect of the invention relates to a static memory device comprising at least one memory cell with two cross-coupled CMOS inverters to be connected between a first voltage, for example ground, and a second voltage, for example a supply voltage.

According to a general characteristic of this aspect of the invention, the substrate of the NMOS transistor of the first inverter is electrically insulated from the substrate of the NMOS transistor of the second inverter by using triple well technology, for example.

The two substrates can furthermore be biased with the first voltage. The memory device comprises a flash clearing controller or means for flash clearing the cell, which can temporarily bring the bias of the substrate of the NMOS transistor of the first inverter to the second voltage.

The invention advantageously provides flash clearing of the memory cell by applying a voltage pulse to the substrate of one of the NMOS transistors of the memory cell. This aspect of the invention is noteworthy in that most of the flash controllers are buried in the substrate of the integrated circuit, and use the substrates of NMOS transistors and contact connections on these samples. These items are already present in an SRAM memory architecture but have not been used for this purpose. For this reason, the memory point density is virtually unchanged.

According to one embodiment of the invention, the flash clearing controller includes a control inverter connected to the substrate contact of the transistor of the first inverter and to a contact pin. The flash clearing controller also includes a signal controller, which can deliver a logic signal in the low state to the pin so as to temporarily bring the bias of the substrate of the NMOS transistor of the first inverter to the second voltage.

According to one embodiment of the invention, the NMOS transistor of the first inverter lies in or on a first semiconductor well with p-type conductivity. The NMOS transistor of the second inverter lies in or on a second semiconductor well with p-type conductivity. These two p-type wells are electrically insulated from each other. They can be biased to the first voltage. They are separated by an n-type well, which can be biased to the second voltage. The two PMOS transistors of the two inverters are formed in this n-type well. The flash clearing controller can temporarily bring the bias of the first well to the second voltage. The control inverter is advantageously connected between the first well and the contact pin.

According to one embodiment of the invention, the device comprises a matrix of memory cells and the flash clearing controller can temporarily and simultaneously bring the bias of the substrates of the NMOS transistors of the first inverters of the cells of at least one column of the matrix to the second voltage. According to this embodiment, the invention thus requires the use of a single inverter per column of the matrix.

The invention is advantageously applied to memory cells having a rectangular structure. More particularly, according to an embodiment of the device in which a set of parallel semiconductor wells is provided, respectively and alternately of the n and p types, the n-type wells can be biased to the second voltage and the p-type wells can be biased to the first voltage. An n-type well includes the PMOS transistors of a column of cells of the matrix, and the two p-type wells lying on either side of the n-type well respectively include the NMOS transistors of the inverters of the column of cells. The flash clearing controller can then bring the bias of one of the two p-type wells of at least a part of the memory device to the second voltage.

In the event that it is desired to clear all of the memory, the flash clearing controller can temporarily and simultaneously bring the bias of the substrates of the NMOS transistors of the first inverters of the cells of all the columns of the matrix to the second voltage. In this case, the flash clearing controller can advantageously bring the bias of one of the two p-type wells of the memory device to the second voltage.

Physically, the flash clearing controller advantageously includes control inverters respectively connected between one of the two p-type wells and contact pins, and a signal controller which can deliver a logic signal in the low state to at least one pin so as to bring the bias of the corresponding p-type well to the second voltage. The signal controller may be able to deliver the logic signal in the low state to all the pins, so as to bring the bias of one of the two p-type wells to the second voltage.

Another aspect of the invention likewise relates to a method for flash clearing a memory device comprising at least one memory cell with two cross-coupled CMOS inverters, to the terminals of which a first voltage and a second voltage are applied. According to a general characteristic of this other aspect of the invention, the substrate of the NMOS transistor of a first inverter is electrically insulated from the substrate of the NMOS transistor of the second inverter. The two substrates are biased with the first voltage, and the bias of the substrate of the NMOS transistor of the first inverter is temporarily brought to the second voltage.

According to an implementation of the invention, the NMOS transistor of the first inverter lies in or on a first semiconductor well with p-type conductivity, and the NMOS transistor of the second inverter lies in or on a second semiconductor well with p-type conductivity. These two p-type wells are electrically insulated from each other, biased to the first voltage and separated by an n-type well, which is biased to the second voltage and in or on which the two PMOS transistors of the two inverters are formed. The bias of the first p-type well is temporarily brought to the second voltage.

According to an implementation of the invention in which the device comprises a matrix of memory cells, the bias of the substrates of the NMOS transistors of the first inverters of the cells of at least one column of the matrix are temporarily and simultaneously brought to the second voltage.

According to an implementation of the invention in which the device comprises a set of parallel semiconductor wells respectively and alternately of the n and p types, the n-type wells are biased to the second voltage and the p-type wells are biased to the first voltage. An n-type well may include the PMOS transistors of a column of cells of the matrix and the two p-type wells, lying on either side of the n-type well, respectively including the NMOS transistors of the inverters of the column of cells. The bias of one of the two p-type wells of at least a part of the memory device is brought to the second voltage.

The bias of the substrates of the NMOS transistors of the first inverters of the cells of all the columns of the matrix may be temporarily and simultaneously brought to the second voltage. In terms of wells, the bias of one of the two p-type wells of the memory device may be brought to the second voltage.

BRIEF DESCRIPTION OF THE DRAWINGS

Other advantages and characteristics of the invention will become apparent on studying the detailed description of embodiments and implementations, which do not imply any limitation, and the appended drawings in which.

DETAILED DESCRIPTION OF THE PREFERRED EMBODIMENTS

Figure 1:
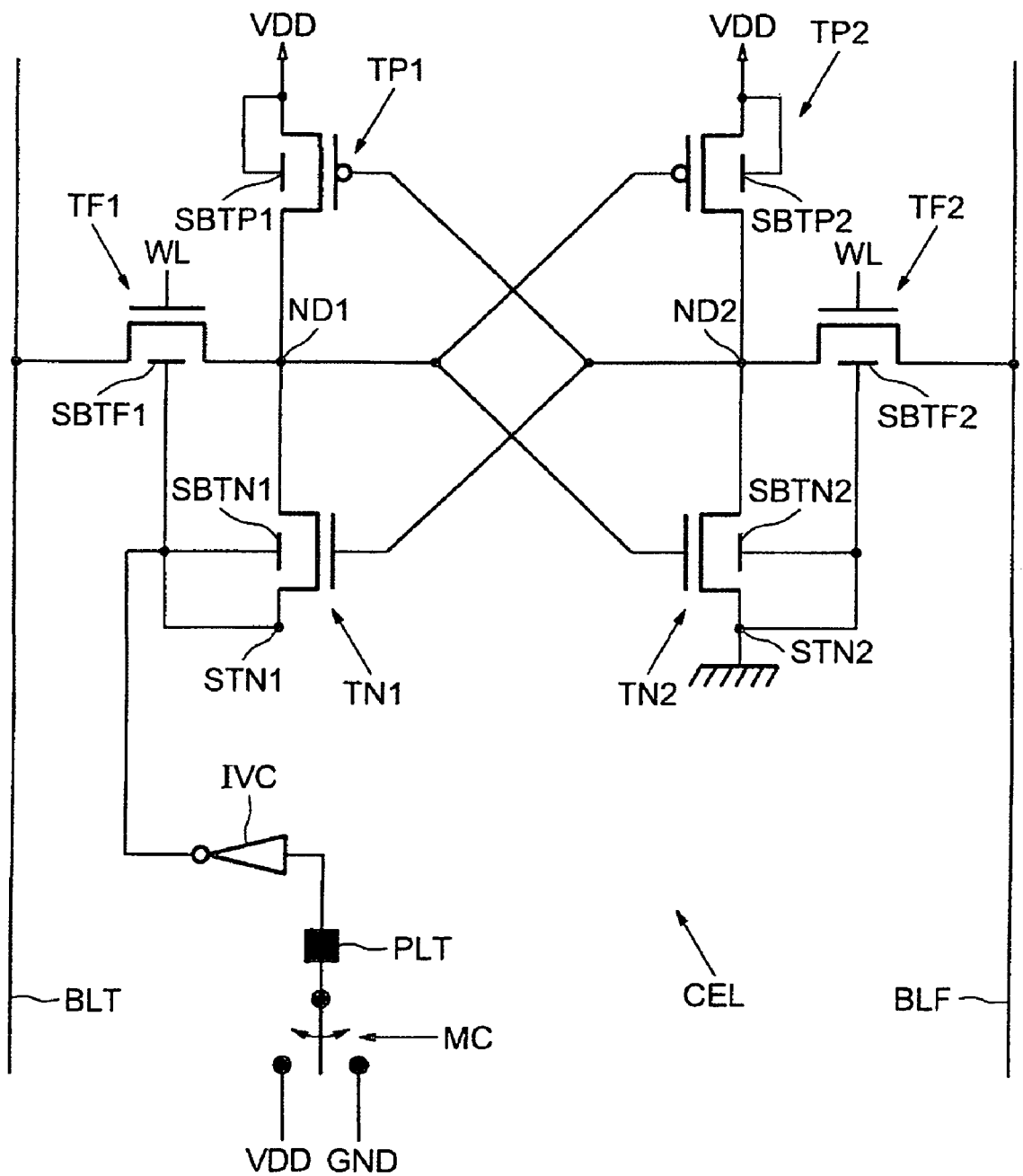
FIG. 1 schematically illustrates an embodiment of a memory cell equipped with flash clearing controller in accordance with the invention.

In FIG. 1, the reference CEL denotes a memory cell of the SRAM type with six transistors. More precisely, the memory cell CEL comprises two cross-coupled CMOS inverters connected between a first voltage, such as ground GND, and a second voltage, such as the supply voltage VDD.

The first inverter is formed by an NMOS transistor TN1 and a PMOS transistor TP1. The second inverter is formed by an NMOS transistor TN2 and a PMOS transistor TP2.

The node ND1 common to the NMOS transistor TN1 and the PMOS transistor TP1 of the first inverter is connected to a first bit line BLT via a transfer transistor TF1, the gate of which is connected to a word line WL. Likewise, the node ND2 common to the NMOS transistor TN2 and the PMOS transistor TP2 of the second inverter is connected to the complementary bit line BLF via another transfer transistor TF2, the gate of which is also connected to the word line WL.

The substrates SBTP1 and SBTP2 of the PMOS transistors TP1 and TP2 are connected to the respective sources of these transistors, and therefore also to the supply voltage VDD. The substrate SBTN1 of the NMOS transistor TN1 is connected to its source STN1, which is furthermore grounded in normal operation, i.e., other than in a flash clear.

The same is true for the substrate SBTN2 of the transistor TN2, which is connected to its likewise grounded source STN2. Furthermore, the substrates SBTF1 and SBTF2 of the transfer transistors TF1 and TF2 are respectively connected to the substrate connections SBTN1 and SBTN2 of the transistors TN1 and TN2.

Control means or a signal controller MC is also provided, which may be external the memory device, for example. The signal controller can deliver a logic signal in the low state to a pin PLT of the integrated circuit containing the memory cell for a flash clear of the cell, as will be seen in more detail below.

This pin PLT is connected to the substrate SBTN1 of the transistor TN1 via a control inverter IVC, which may advantageously be produced in an integrated fashion within the integrated circuit. As a variation, the control inverter IVC could form part of a control circuit which contains the signal controller MC and is arranged outside or external the integrated circuit.

The signal controller is schematically represented in FIG. 1 by a controlled switch, which can connect the pin PLT either to ground GND or the supply voltage VDD. In normal operation of the cell, the supply voltage VDD is applied to the pin PLT. The source of the transistor TN1 and the substrates of the transistors TN1 and TF1 are therefore grounded.

The substrate of the NMOS transistor TN1 is furthermore electrically insulated from the substrate of the NMOS transistor TN2. One exemplary embodiment of such an insulation is obtained by a so-called triple well technology, as illustrated by way of a non-limiting example in FIG. 2.

More precisely, a buried well NISO of n-type conductivity is arranged within a substrate SB of p-type conductivity. Above the buried well NISO, there are two wells CSP having the p-type conductivity, separated by a well CSN of n-type conductivity.

Figure 2:
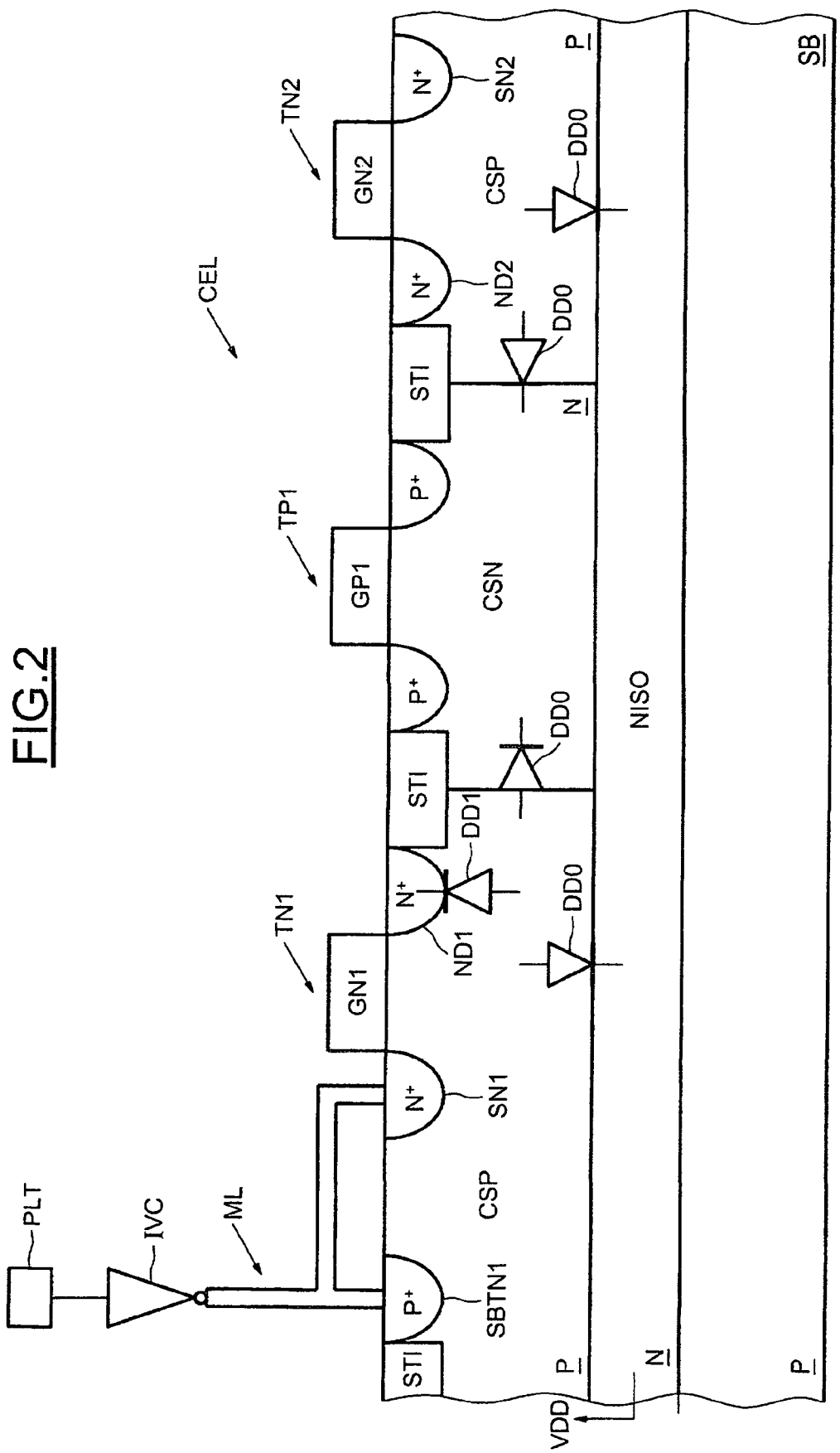
FIG. 2 is a schematic representation of one embodiment of a memory cell at the integrated circuit level in accordance with the invention.

The NMOS transistors TN1 and TF1 are formed in the well CSP lying on the left-hand part of FIG. 2, whereas the NMOS transistors TN2 and TF2 are formed in the well CSP lying on the right-hand part of FIG. 2. The two PMOS transistors TP1 and TP2 are formed in the well CSN.

Figure 3:
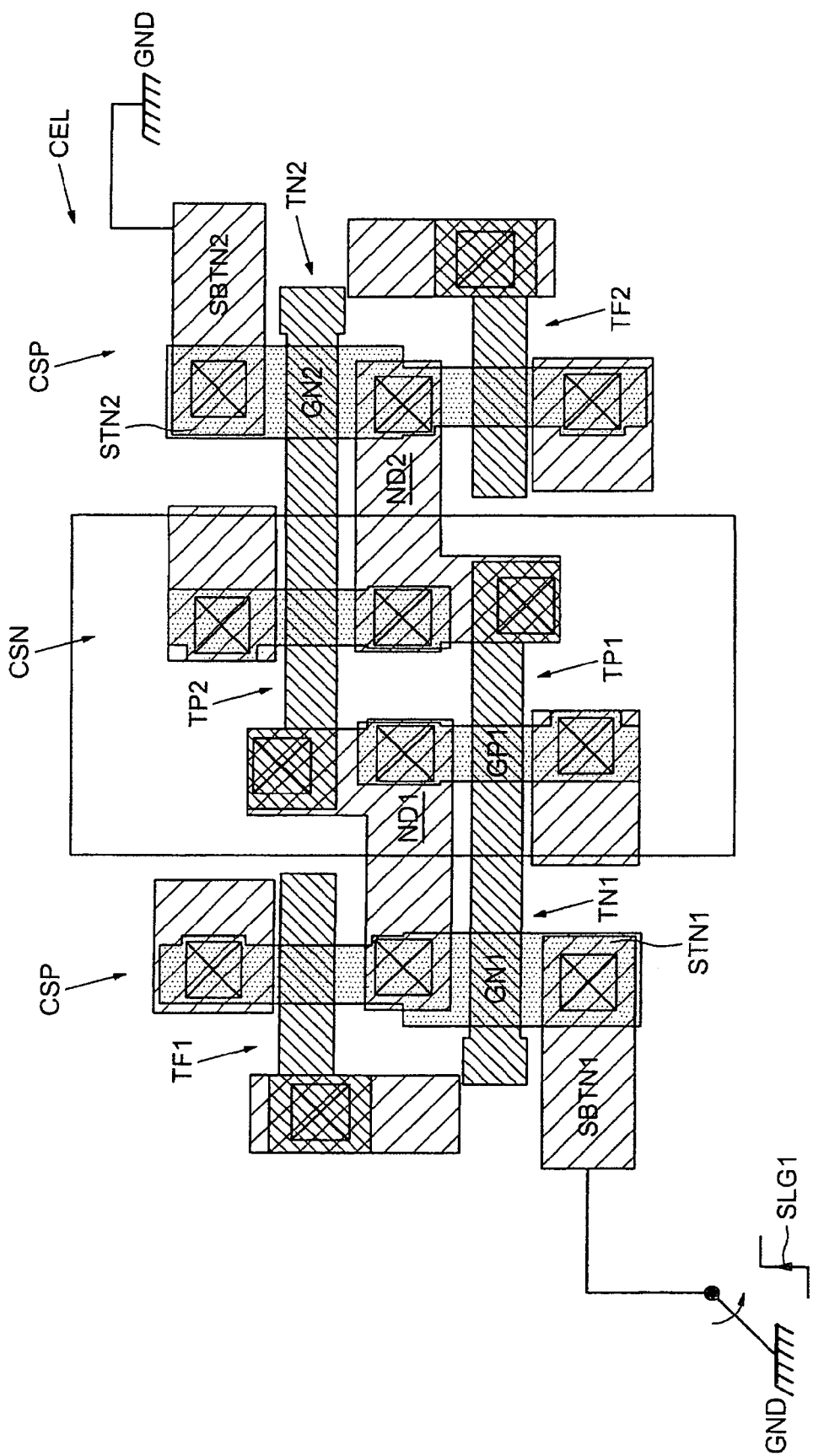
FIG. 3 is a more detailed schematic representation of one embodiment of a memory cell at the integrated circuit level in accordance with the invention.

Only the transistors TN1, TP1 and TP2 have been schematically represented in FIG. 2 for the sake of simplicity. Conversely, all the transistors have been represented on the layout diagram in FIG. 3. The well NISO is brought to the supply voltage VDD by a well connection (not shown in FIG. 2). The same is true for the well CSN.

Furthermore, the wells CSP are for their part grounded. This is in all cases in regards to the well CSP within which the transistor TN2 is formed, and during operation of the memory other than a flash clear in regards to the well CSP within which the transistor TN1 is formed. Consequently, the two wells CSP are insulated from each other by the various PN diodes referenced DDO.

An electrical connector, formed by metal tracks and vias, for example, connect the inverter IVC and the pin PLT to the over doped zones SBTN1 and SN1. Assuming that the memory cell CEL is programmed with a logical 1 corresponding, for example, to the situation in FIG. 4 where the node ND1 is grounded (logical state 0), and where the node ND2 is brought to the supply voltage VDD (logical state 1). This is only a conventional example, and a reverse logic could of course be adopted.

Figure 4:
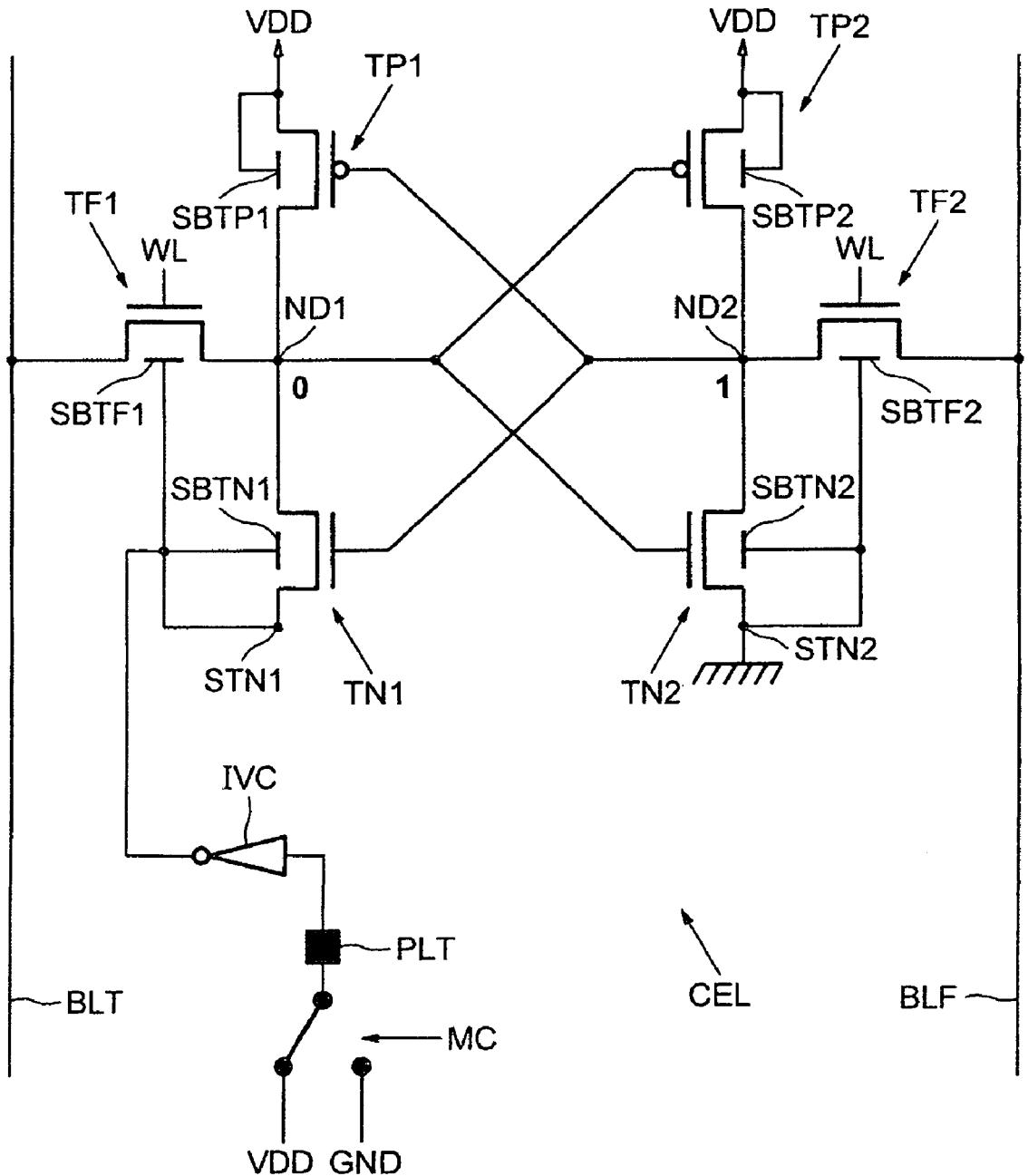
FIG. 4 schematically illustrates an implementation of a memory cell in accordance with the invention.
Figure 5:
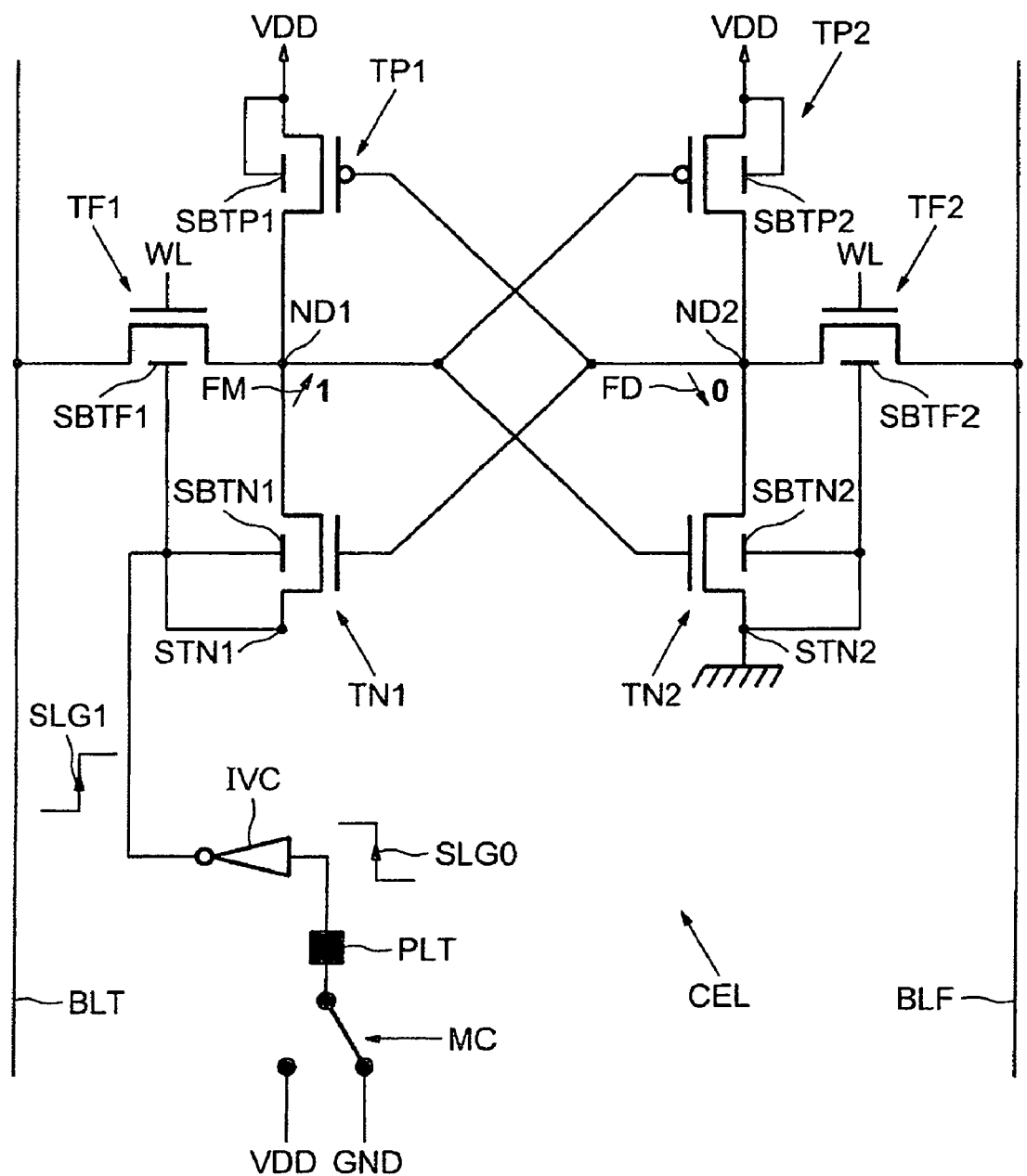
FIG. 5 schematically illustrates another implementation of a memory cell in accordance with the invention.

In the case of FIG. 4, the substrates of the NMOS transistors TN1 and TF1 are grounded, for example, by applying the supply voltage VDD to the pin PLT. When it is desired to flash clear the memory cell CEL, the signal controller MC applies a logic signal in the low state SLG0 to the pin PLT, as illustrated in FIG. 5. For example, the signal control MC applies the ground potential to the pin PLT. A logic signal in the high state SLG1, such as the supply voltage, for example, is consequently then applied to the substrate connections SBTN1. The effect of which is to turn on the diode DD1 (FIG. 2), and therefore, raise the node ND1 to 1 (arrow FM in FIG. 5).

This results in lowering of the node ND2 to zero (arrow FD in FIG. 5). The logic configuration illustrated in FIG. 5 is then encountered, which effectively corresponds to a memory cell CEL in its logical 0 state.

In this exemplary embodiment and implementation, the flash clear of the memory cell thus included temporarily bringing the bias of the substrate of the NMOS transistor TN1 of the first inverter formed by the transistors TN1 and TP1, i.e., the inverter whose common node ND1 was initially in the logical 0 state, to the supply voltage.

The person skilled in the art will of course know how to adjust the minimum necessary application time of the supply voltage to the substrate of the NMOS transistor TN1 so as to make it possible to raise the node ND1 to a logical 1 state. By way of indication, such a duration may be on the order of 1 nanosecond. At the end of this duration, the ground potential is again applied to the substrates of the transistor TN1 and of the transistor TF1.

Figure 6:
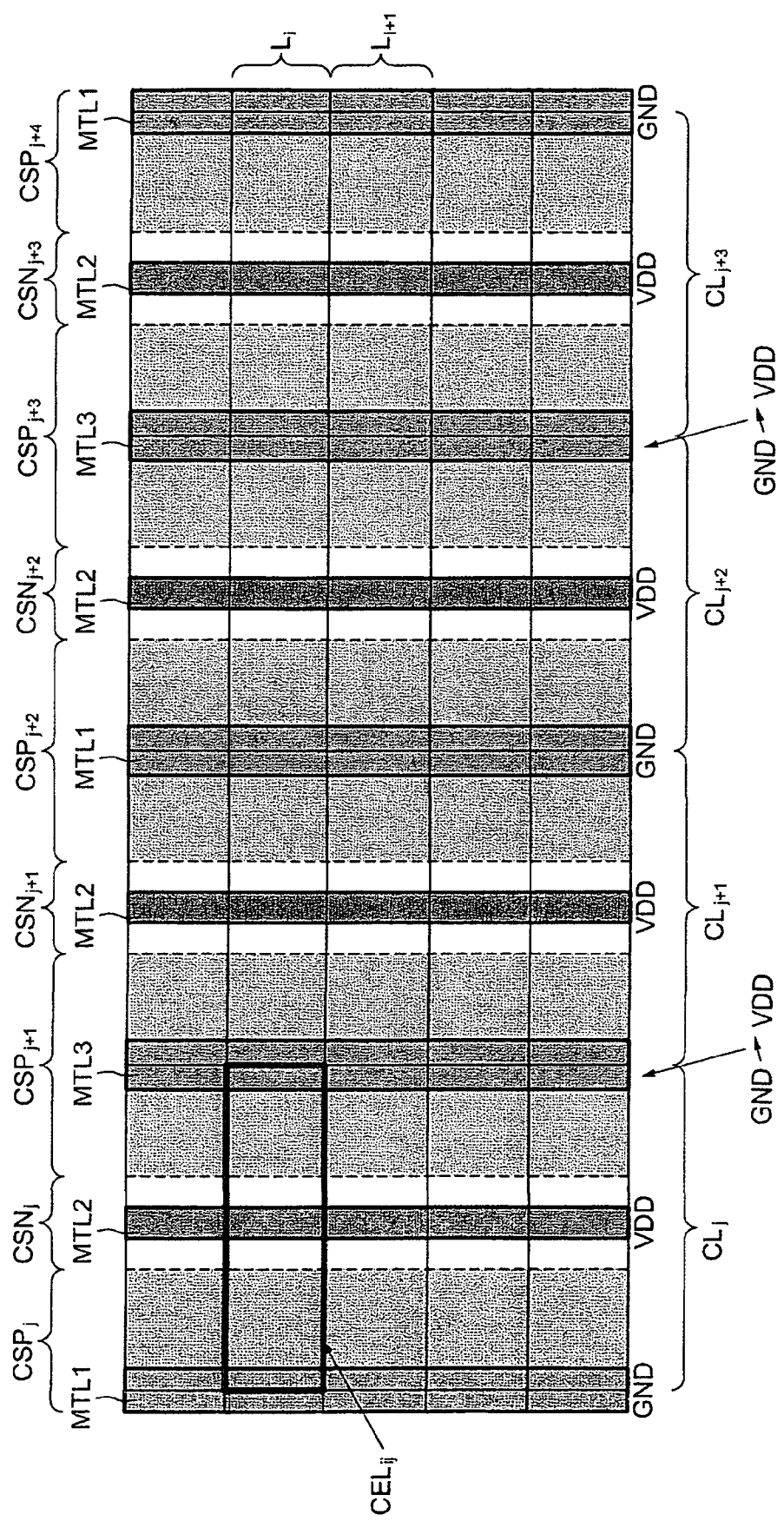
FIG. 6 schematically illustrates another embodiment and implementation of a device in accordance with the invention.

Reference will now be made more particularly to FIG. 6, which partially and schematically illustrates a memory device comprising a matrix of memory cells $CEL_{ij}$. This matrix is formed by lines $L_i$ and columns $CL_j$.

The memory device in FIG. 6 furthermore includes a set of parallel semiconductor wells respectively and alternately of the n and p types. The PMOS transistors of the cell $CEL_{ij}$ are thus formed in the well CSN, whereas the transistor TN1 of the first inverter of this cell plus the transfer transistor TF1 are formed in the well $CSP_j$. The transistor TN2 of the second inverter of the cell plus the transfer transistor TF2 are formed in the cell $CSP_{j+1}$. The well $CSP_{j+1}$ also makes it possible to form the transistors TN2 and TF2 of the cell which is adjacent to the cell $CEL_{ij}$ and lies in the column $CL_{j+1}$.

Common column metallizations MTL2 make it possible to bias the various wells CSN to the supply voltage VDD. Common metallizations MTL1 arranged on one of the two wells CSP make it possible to bias these wells to the ground potential GND. Furthermore, metallizations MTL3 are arranged on the other wells CSP so as to be able to bias these wells CSP either to the ground potential GND or to the supply voltage VDD when it is desired to clear all the cells of the column in question.

The invention is thus straightforward in so far as it requires the use of a single control inverter per column, making it possible to simultaneously flash clear all the cells of a column. It is of course possible to clear the cells simply of certain columns, or even to clear the entire memory, which then equates to temporarily bringing one of the two wells CSP to the supply voltage VDD.

That which is claimed is:

1. A memory device comprising:
    a substrate comprising at least one first substrate portion and at least one second substrate portion;
    at least one memory cell comprising
        first and second cross-coupled CMOS inverters to be coupled to a first voltage and to a second voltage, and said first CMOS inverter comprising an NMOS transistor in the at least one first substrate portion, and said second CMOS inverter comprising an NMOS transistor in the at least one second substrate portion;
    the at least one first and second substrate portions being electrically isolated from one another, and being biased with the first voltage; and
    a flash clearing controller for flash clearing said at least one memory cell by temporarily biasing the at least one first substrate portion to the second voltage.

2. A memory device according to claim 1, wherein said flash clearing controller comprises:
    a control inverter coupled to said NMOS transistor of said first CMOS inverter;
    a contact pin coupled to said control inverter; and
    a signal controller for delivering a logic signal in a low state to said contact pin for temporarily biasing the at least one first substrate portion to the second voltage.

3. A memory device according to claim 2, wherein the at least one first substrate portion defines at least one first well with a p-type conductivity; wherein the at least one second substrate portion defines at least one second well with the p-type conductivity; said substrate further comprising at least one third substrate portion defining at least one third well with n-type conductivity, the at least one third well separating the at least one first and second wells; and
    said first CMOS inverter comprising a PMOS transistor in the at least one third well, and said second CMOS inverter comprising a PMOS transistor in the at least one third well, with the at least one third well being biased to the second voltage.

4. A memory device according to claim 3, wherein said control inverter is coupled between the at least one first well and said contact pin.

5. A memory device according to claim 1, wherein said at least one memory cell comprises a plurality of memory cells forming a matrix of memory cells; and wherein said flash clearing controller temporarily biases the at least one first substrate portions of said NMOS transistors of said first inverters of said plurality of memory cells of at least one column of said matrix to the second voltage.

6. A memory device according to claim 5, wherein the at least one first substrate portion comprises a plurality of first substrate portions defining first wells with a p-type conductivity; wherein the at least one second substrate portion comprises a plurality of second substrate portions defining second wells with the p-type conductivity; said substrate further comprising a plurality of third substrate portions defining third wells with n-type conductivity, the third wells separating the first and second wells and being parallel to one another;

the n-type wells being biased to the second voltage and the p-type wells can be biased to the first voltage;

each first CMOS inverter comprising a PMOS transistor in the n-type well, and each second CMOS inverter comprising a PMOS transistor in the n-type well;

a respective n-type well including the PMOS transistors of a column of cells of the matrix and the two p-type wells, lying on either side of the n-type well, respectively including the NMOS transistors of the inverters of the column of cells; and said flash clearing controller biasing one of the two p-type wells of at least a portion of the memory device to the second voltage.

7. A memory device according to claim 6, wherein said flash clearing controller temporarily biases the substrates of the NMOS transistors of the first inverters of the memory cells of all the columns of the matrix to the second voltage.

8. A memory device according to claim 6, wherein said flash clearing controller biases every other p-type well of the memory device to the second voltage.

9. A memory device according to claim 6, wherein said flash clearing controller comprises:

a respective control inverter coupled to an NMOS transistor of said first CMOS inverter in one of the two p-wells;

a plurality of contact pins, each contact pin coupled to a respective control inverter; and a signal controller for delivering a logic signal in a low state to said plurality of contact pins for temporarily biasing the corresponding p-type well to the second voltage.

10. A memory device according to claim 9, wherein said signal controller delivers the logic signal in the low state to all of said plurality of contact pins so as to bias every other p-type well to the second voltage.

11. A memory device comprising:

a substrate comprising at least one first substrate portion with a p-type conductivity, at least one second substrate portion with the p-type conductivity, and at least one third substrate portion with an n-type conductivity separating the at least one first and second substrate portions;

at least one memory cell in said substrate and comprising first and second cross-coupled CMOS inverters to be coupled to a first voltage and to a second voltage, and said first CMOS inverter comprising an NMOS transistor in the at least one first substrate portion and a PMOS transistor in the at least one third substrate portion, and said second CMOS inverter comprising an NMOS transistor in the at least one second substrate portion and a PMOS transistor in the at least one third substrate portion;

the at least one first and second substrate portions being electrically isolated from one another, and being biased with the first voltage; and a flash clearing controller for flash clearing said at least one memory cell by temporarily biasing the at least one first substrate portion to the second voltage.

12. A memory device according to claim 11, wherein said flash clearing controller comprises:

a control inverter coupled to said NMOS transistor of said first CMOS inverter;

a contact pin coupled to said control inverter; and a signal controller for delivering a logic signal in a low state to said contact pin for temporarily biasing the at least one first substrate portion to the second voltage.

13. A memory device according to claim 12, wherein the third substrate portion is biased to the second voltage.

14. A memory device according to claim 12, wherein said control inverter is coupled between the at least one first substrate portion and said contact pin.

15. A memory device according to claim 11, wherein said at least one memory cell comprises a plurality of memory cells forming a matrix of memory cells; and wherein said flash clearing controller temporarily biases the at least one first substrate portions of said NMOS transistors of said first inverters of said plurality of memory cells of at least one column of said matrix to the second voltage.

16. A method for flash clearing a memory device comprising a substrate comprising at least one first substrate portion and at leas tone second substrate portion; at least one memory cell comprising first and second cross-coupled CMOS inverters; the first CMOS inverter comprising an NMOS transistor in the at least one first substrate portion; and the second CMOS inverter comprising an NMOS transistor in the at least one second substrate portion, the method comprising:

coupling the first and second cross-coupled CMOS inverters to a first voltage and to a second voltage;

biasing the at least one first and second substrate portions with the first voltage, the at least one first and second substrate portions being electrically isolated from one another; and temporarily biasing the at least one first substrate portion to the second voltage for flash clearing the at least one memory cell.

17. A method according to claim 16, wherein the at least one first substrate portion defines at least one first well with a p-type conductivity; wherein the at least one second substrate portion defines at least one second well with the p-type conductivity; the substrate further comprising at least one third substrate portion defining at least one third well with n-type conductivity, the at least one third well separating the at least one first and second wells; and the first CMOS inverter comprising a PMOS transistor in the at least one third well, and said second CMOS inverter comprising a PMOS transistor in the at least one third well, with the at least one third well being biased to the second voltage.

18. A method according to claim 16, wherein the device comprises a matrix of memory cells, and in that the bias of the first substrate portions of the NMOS transistors of the first inverters of the memory cells of at least one column of the matrix are temporarily brought to the second voltage.

19. A method according to claim 18, wherein the memory device comprises a set of parallel semiconductor wells respectively and alternately of the n and p types, the n-type wells being biased to the said second voltage and the p-type wells being biased to the said first voltage, an n-type well including the PMOS transistors of a column of cells of the matrix and the two p-type wells, lying on either side of the n-type well, respectively including the NMOS transistors of the inverters of the column of cells, and in that the bias of one of the two p-type wells of at least a part of the memory device is brought to the second voltage.

20. A method according to claim 19, wherein the at least one memory cell comprises a plurality of memory cells forming a matrix of memory cells; and wherein the biasing to the second voltage of the at least one first substrate portions of the NMOS transistors of the first inverters of the plurality of memory cells of at least one column of the matrix is temporary.

21. A method according to claim 20, wherein the bias to the second voltage is applied to every other one of the p-type wells of the memory device.

* * * * *

UNITED STATES PATENT AND TRADEMARK OFFICE
CERTIFICATE OF CORRECTION

| | |
|---|---|
| PATENT NO. | : 7,333,380 B2 |
| APPLICATION NO. | : 11/394873 |
| DATED | : February 19, 2008 |
| INVENTOR(S) | : Jean-Pierre Schoellkopf |

It is certified that error appears in the above-identified patent and that said Letters Patent is hereby corrected as shown below:

Column 1, Line 40        Delete: "invention to"
                                    Insert: --invention is to--

Column 8, Line 30        Delete: "at leas tone"
                                    Insert: --at least one--

Signed and Sealed this

Twenty-third Day of September, 2008

JON W. DUDAS
*Director of the United States Patent and Trademark Office*